US012191329B2

(12) United States Patent
McGrath (10) Patent No.: US 12,191,329 B2
(45) Date of Patent: Jan. 7, 2025

(54) UNIFORM-BRIDGE-GRADIENT TIME-OF-FLIGHT PHOTODIODE FOR IMAGE SENSOR PIXEL

(71) Applicant: Shenzhen Goodix Technology Co., Ltd., Shenzhen (CN)

(72) Inventor: Robert Daniel McGrath, San Diego, CA (US)

(73) Assignee: Shenzhen Goodix Technology Co., Ltd., Shenzhen (CN)

(*) Notice: Subject to any disclaimer, the term of this patent is extended or adjusted under 35 U.S.C. 154(b) by 530 days.

(21) Appl. No.: 17/527,170

(22) Filed: Nov. 16, 2021

(65) Prior Publication Data

US 2023/0154947 A1 May 18, 2023

(51) Int. Cl.
| | |
|---|---|
| *H01L 27/146* | (2006.01) |
| *H01L 25/16* | (2023.01) |
| *H01L 31/0224* | (2006.01) |
| *H04N 25/705* | (2023.01) |
| *H04N 25/75* | (2023.01) |
| *H04N 25/778* | (2023.01) |

(52) U.S. Cl.
CPC ........ *H01L 27/1461* (2013.01); *H01L 25/167* (2013.01); *H01L 27/14643* (2013.01); *H01L 31/0224* (2013.01); *H04N 25/705* (2023.01); *H04N 25/75* (2023.01); *H04N 25/778* (2023.01)

(58) Field of Classification Search
CPC ............... H01L 27/1461; H01L 25/167; H01L 27/14643; H01L 31/0224; H04N 25/778; H04N 25/705; H04N 25/75
See application file for complete search history.

(56) References Cited

U.S. PATENT DOCUMENTS

2011/0198481 A1 8/2011 Kim et al.

*Primary Examiner* — Monica D Harrison
*Assistant Examiner* — Christopher A Culbert
(74) *Attorney, Agent, or Firm* — Kilpatrick Townsend & Stockton LLP (57) ABSTRACT

A uniform bridge gradient (UBG) time-of-flight (ToF) photodiode block is described, such as for integration with image sensor pixels. The UBG ToF photodiode block can be part of a UBG ToF pixel, and an image sensor can include an array of such pixels. Each UGB ToF photosensor block has multiple taps for selective activation, and a photodiode region designed for complete and rapid transit of photocarriers, as they are generated, via the multiple taps. Embodiments of the photodiode region include a photodiode-defining implant, a relatively shallow first bridging implant, and relatively deep second bridging implant. The bridging implants provide lateral bridging with a uniform doping gradient near and across the multiple taps.

20 Claims, 6 Drawing Sheets

(Prior Art)

FIG. 3

(Prior Art)

FIG. 4

(Prior Art)

UNIFORM-BRIDGE-GRADIENT TIME-OF-FLIGHT PHOTODIODE FOR IMAGE SENSOR PIXEL

FIELD

The present invention relates generally to complementary metal-oxide semiconductor (CMOS) image sensors. More particularly, embodiments relate to uniform-bridge-gradient time-of-flight (ToF) photodiodes for integration with CMOS image sensor (CIS) pixels.

BACKGROUND

Many modern electronics applications include integrated digital cameras and/or other digital imaging systems, which are based on complementary metal-oxide semiconductor (CMOS) image sensor (CIS) technologies. A digital imaging system is typically implemented by one or more arrays of pixels, each including one or more photo-sensors (e.g., photodiodes), or a grouping of multiple photo-sensors. Each pixel or group of pixels can also include supporting hardware, such as source-follower, select, and reset transistors for converting the optical responses of the photo-sensors into corresponding electrical signals for use by other components.

Some digital imaging applications include depth sensing features, such as for assisting with autofocus and/or three-dimensional imaging. Depth sensing can be performed in various ways, including using time-of-flight (ToF) techniques. Typically, an illuminator, such as an infrared illumination, a Vertical Cavity Surface Emitting Laser (VC-SEL), or the like, outputs light pulses. The illumination bounces off of a scene object and reflects back to ToF photo-sensors, such that some roundtrip time elapses between outputting the illumination and detecting the reflection. The roundtrip time is a function of distances and geometric relationships between the image sensor components and the scene object. As such, a relative time shift between outputting the illumination and detecting its reflection can indicate a roundtrip distance traveled by the illumination, which can be used to compute a distance (depth) measurement between the imaging system and the scene object.

Some modern ToF approaches use a so-called ToF photodiode. Such ToF photodiodes typically switch rapidly and periodically between activating each of multiple output taps. Received photons are converted into photocarriers (i.e., electrons or holes), which are directed to whichever output tap is active at the time. Rather than collecting charge in the photodiode itself, charge is collected at each output tap as photocarriers are selectively directed to the output taps. The relative difference in charge collected at the different output taps can change based on a distance of the scene object from the imaging system. In an ideal ToF photodiode, in which photocarriers entering the device are immediately collected at a presently active output tap with zero delay, an accurate correlation can be computed between the relative charge collected at each output tap and a detected distance of a scene object. However, the accuracy of such a correlation tends to be limited in conventional ToF photocarriers by device non-idealities and sub-optimal design.

BRIEF SUMMARY OF THE INVENTION

Embodiments provide circuits, devices, and methods for implementing a uniform-bridge-gradient (UBG) time-of-flight (ToF) photodiodes for integration with digital imaging systems. The UBG ToF photodiode block can be part of a UBG ToF pixel, and an image sensor can include an array of such pixels. Each UGB ToF photosensor block has multiple taps for selective activation, and a photodiode region designed for complete and rapid transit of photocarriers, as they are generated, via the multiple taps. Embodiments of the photodiode region include a photodiode-defining implant, a relatively shallow first bridging implant, and relatively deep second bridging implant. The bridging implants provide lateral bridging with a uniform doping gradient near and across the multiple taps. The deeper bridging implant can generate an enhanced band of fringing fields near the taps to improve lateral and vertical photocharge transit time. The shallower bridging implant can have a uniform bridging critical dimension that creates a lateral field to improve photocarrier transit time without creating localized potential wells that can impede photocarrier transit.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
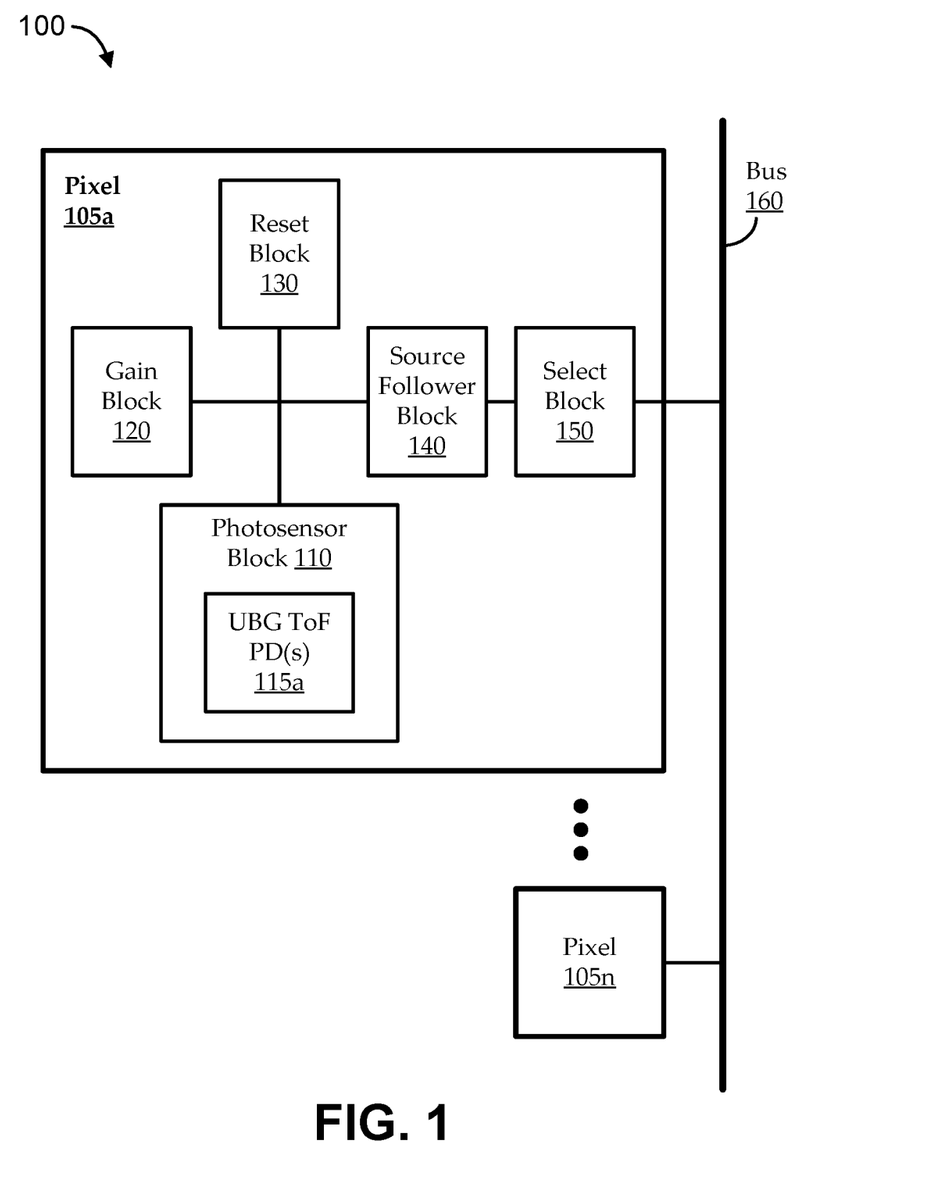
FIG. 1 shows a simplified block diagram of a portion of an illustrative digital imaging system, as context for various embodiments described herein.

FIG. 1 shows a simplified block diagram of a portion of an illustrative digital imaging system 100, as context for various embodiments described herein. The digital imaging system 100 can be built around a complementary metal-oxide semiconductor (CMOS) image sensor (CIS) technology. Such a CIS system can typically include one or more arrays of pixels 105, such as a large number of pixels 105 arranged in rows and columns. Each pixel 105 can include a photo-sensor block 110, which can include a single photodiode 115 (e.g., or any suitable photo sensor), or a grouping of multiple photodiodes 115. Each photo-sensor block 110 of the digital imaging system 100 illustrated in FIG. 1 includes one or more uniform-bridge-gradient (UBG) time-of-flight (ToF) photodiodes 115, as described herein.

The pixel 105 also includes additional components to facilitate sage of the photo-sensor block 110 for optical sensing. As illustrated, embodiments can include a gain block 120, a reset block 130, a source-follower block 140, and a select block 150. The gain block 120 can control gain for the pixel 105, such as by implementing dual conversion gain (DCG). The reset block 130 can selectively reset the pixel 105 components. The source-follower block 140 can support conversion of outputs from the photo-sensor block 110 into an electrical signal indicative of optical information detected by the photo-sensor block 110. The select block 150 can support selection of the pixel 105 signals from among the array of pixels 105, for example responsive to a control signal received via a bus 160. For example, the bus 160 may be a column select bus, or the like.

Figure 2:
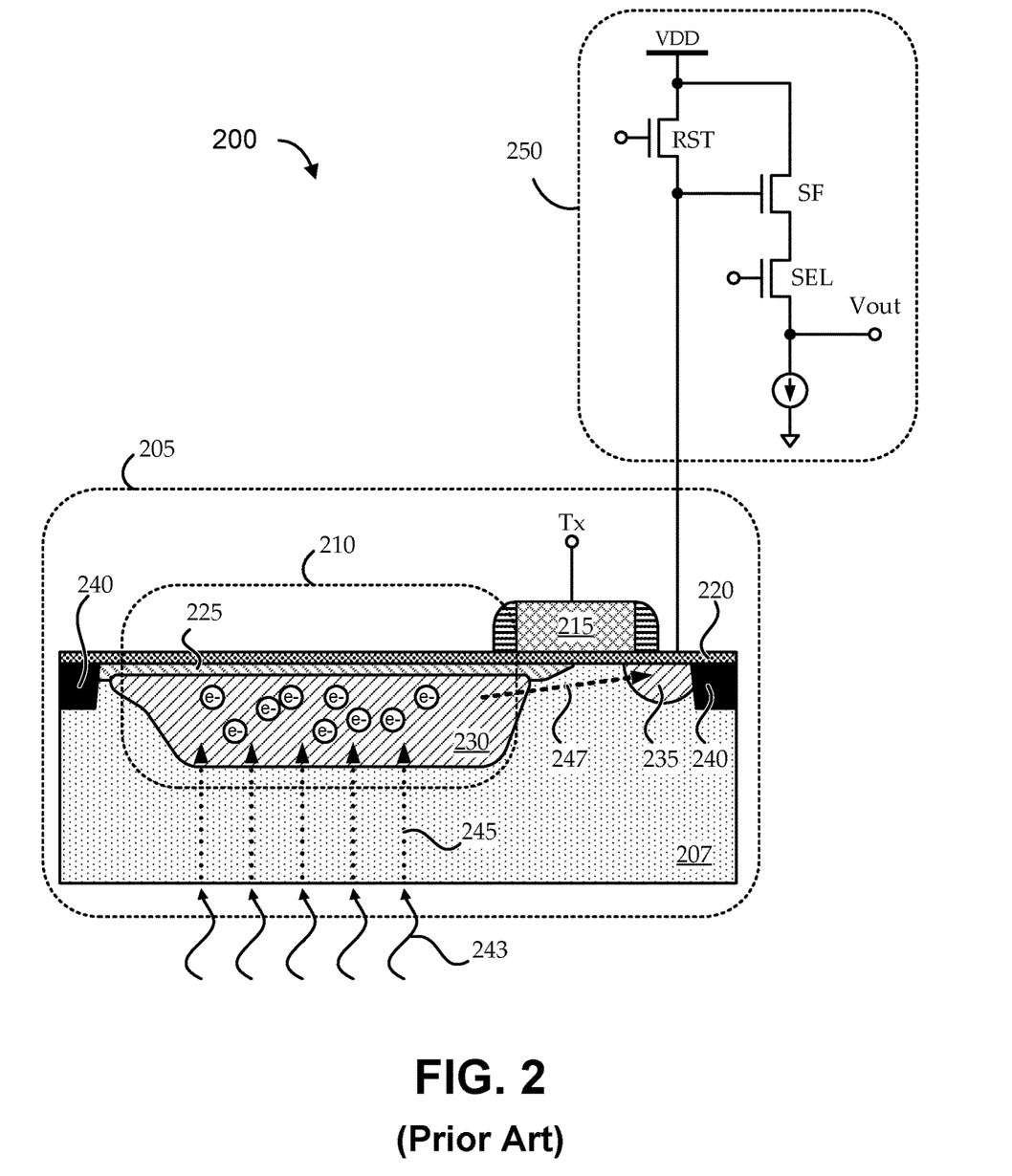
FIG. 2 shows an example of a conventional CIS pixel implementation that includes a conventional pinned photodiode (PPD) configured for backside illumination.

In a conventional (i.e., not ToF) photodiode, the photodiode is exposed to illumination, and charge is collected in the device based on the amount of illumination (e.g., number of photons received at the device during the exposure time). For the sake of illustration, FIG. 2 shows an example of a conventional CIS pixel implementation 200 that includes a conventional pinned photodiode (PPD) 210 configured for backside illumination. The pixel implementation 200 includes a photosensor block 205 (that can be considered as including the conventional PPD 210 itself) and a readout structure 250 having a reset transistor (RST), a source follower transistor (SF), and a select transistor (SEL). As noted above, the conventional PPD 210 is illustrated as configured for backside illumination; a similar conventional PPD 210 implementation can be used for front-side illumination configurations.

The photosensor block 205 includes a transfer gate 215 that can be activated by a Tx signal and can be isolated from a substrate 207 by an oxide layer 220. The substrate 207 can be a silicon wafer, or the like, having a first doping type (e.g., P-type). On one side of the transfer gate 215, the conventional PPD 210 can be formed by implanting into the substrate 207 a shallow first-doping-type (e.g., P-type) pinning region 225 and a deeper second-doping-type (e.g., N-type) collection region 230. On the opposite side of the transfer gate 215, a floating diffusion region 235 can be formed by implanting another second-doping-type (e.g., N-type) well into the substrate 207. Isolation regions 240 (e.g., shallow-trench isolation, STI) can be formed to electrically isolate structures of the photosensor block 205 from those of adjacent photosensor blocks and/or pixels.

As photons reach the backside of the substrate 207 (e.g., illustrated by arrows 243), they can be converted into photocarriers (i.e., electrons and holes), one of which being attracted to and collected in the collection region 230 (e.g., illustrated by dotted arrows 245). The accumulation of photocarriers in the collection region 230 can be considered generally as an accumulation of charge. For example, longer and/or brighter exposure can result in a greater accumulation of charge in the collection region 230. Activating the Tx signal can form a depletion region below the transfer gate 215, which effectively becomes a current channel between the two second-doping-type (e.g., N-type) regions: the collection region 230 and the floating diffusion region 235. As such, activation of the transfer gate 215 causes accumulated charge in the collection region 230 to transfer across the current channel to the floating diffusion region 235.

The charge transferred to the floating diffusion region 235 can be read out by the readout structure 250. For example, a gate voltage can be generated based on the charge at the floating diffusion region 235, which can drive a gate of SF (previously reset by actuating RST). As illustrated, SEL is coupled between a source terminal of SF and an output voltage terminal (Vout), and a constant current source is coupled between Vout and ground. As such, when the select transistor is activated (e.g., as part of a row select operation), an output voltage is generated at Vout based on the gate voltage.

It can be seen that in a typical CIS implementation of a conventional (non-ToF) PPD 210, the pixel output signal (e.g., as indicated by the output voltage level at Vout) is effectively related to the amount of charge accumulated in the conventional PPD 210 over an exposure time. In this way, an array of such CIS pixels can be used to measure amounts of light (e.g., of particular colors, etc.) being received from different locations in a scene, thereby facilitating forming an image of the scene. Embodiments described herein relate to ToF photodiodes. Rather than facilitating imaging of a scene, ToF photodiodes seek to use optical return time to measure distances between the image sensor and locations in the scene. Unlike non-ToF photodiodes, such as the conventional PPD 210, ToF photodiodes typically are not designed to accumulate charge within the photodiode. Instead, at any given time, ToF photodiodes seek rapidly to shuttle photocarriers out of the photodiode via a presently selected one of multiple output taps into a corresponding one of multiple accumulation nodes. Relative accumulations of charge in the different accumulation nodes can be used to compute distance measurements.

Figure 3:
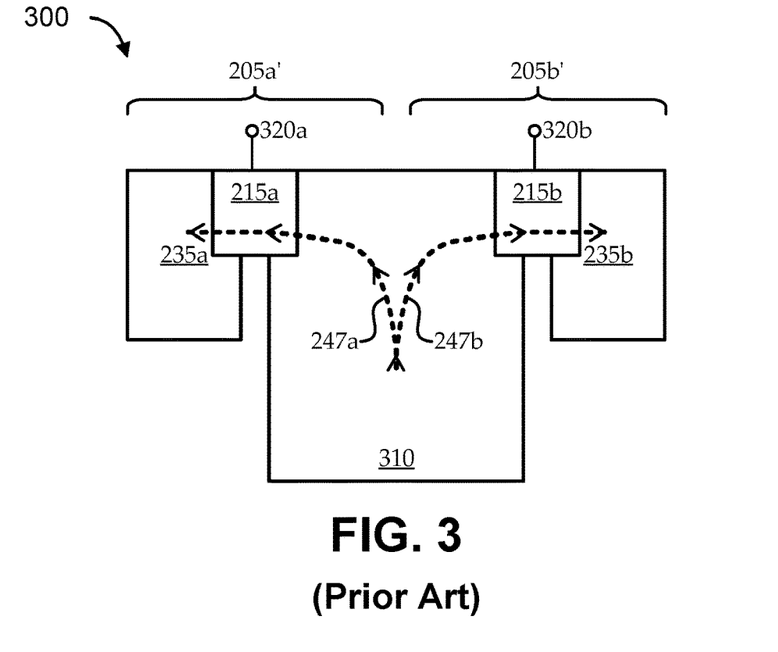
FIG. 3 shows a simplified planar view of a conventional time-of-flight (ToF) photodiode block.

For added context, FIG. 3 shows a simplified planar view of a conventional ToF photodiode block 300. The conventional ToF photodiode block 300 includes a photodiode region 310, two transfer gates 215, and two floating diffusion regions 235. Such a ToF photodiode block is sometimes referred to by those of skill in the art as a "ToF photodiode," a "ToF pixel," a "ToF sensor," or the like. The term "ToF photodiode block" is used herein to clearly reference the entire block, including the detection portion (i.e., the photodiode region 310) and the transfer portion (i.e., the transfer gates 215 and floating diffusion regions 235); as opposed to only the photodiode region 310 of the block, or the pixel in which the ToF photodiode block is incorporated (which may include multiple ToF photodiode blocks, readout structure components, etc.). The photodiode region 310 can be implemented in any suitable manner. In some implementations, the photodiode region 310 is implemented as a pinned photodiode (PPD). For example, the conventional ToF photodiode block 300 can be implemented effectively as two mirror-image instances of the non-ToF photosensor block 205 of FIG. 2 (indicated generally as regions 205$a'$ and 205$b'$) that share the conventional PPD 210 portion. As such, the photodiode region 310 includes a shallow P-type pinning region and a deeper N-type pinning region configured for backside illumination. Each transfer gate 215 (i.e., the transfer gate 215 corresponding to each instance of the photosensor block in its respective region 205') is disposed between the photodiode region 310 and a respective one of the floating diffusion regions 235.

Each transfer gate 215 is selectively activated by a respective activation signal 320, such that only one of the transfer gates 315 is active at any time. Switching between the transfer gates 315 can occur very rapidly and periodically and can be synchronous with modulation of an illumination source. At any given time, activating one of the transfer gates 215 forms a depletion region below that transfer gate 215, which can provide a current channel between the photodiode region 310 and the one of the floating diffusion regions 235 associated with the activated transfer gate 215. As described above, as photons hit the backside of the photodiode region 310 (with sufficient energy), they are converted into photocarriers (i.e., electrons or holes). Rather than accumulating in a collection region within the photodiode region 310 (e.g., as in the conventional PPD 210 of FIG. 2), as photocarriers are generated in the photodiode region 310, they are shuttled into the currently active floating diffusion region 230 via the channel formed below the currently active transfer gate 315 (as illustrated by dotted arrows 247).

Figure 4:
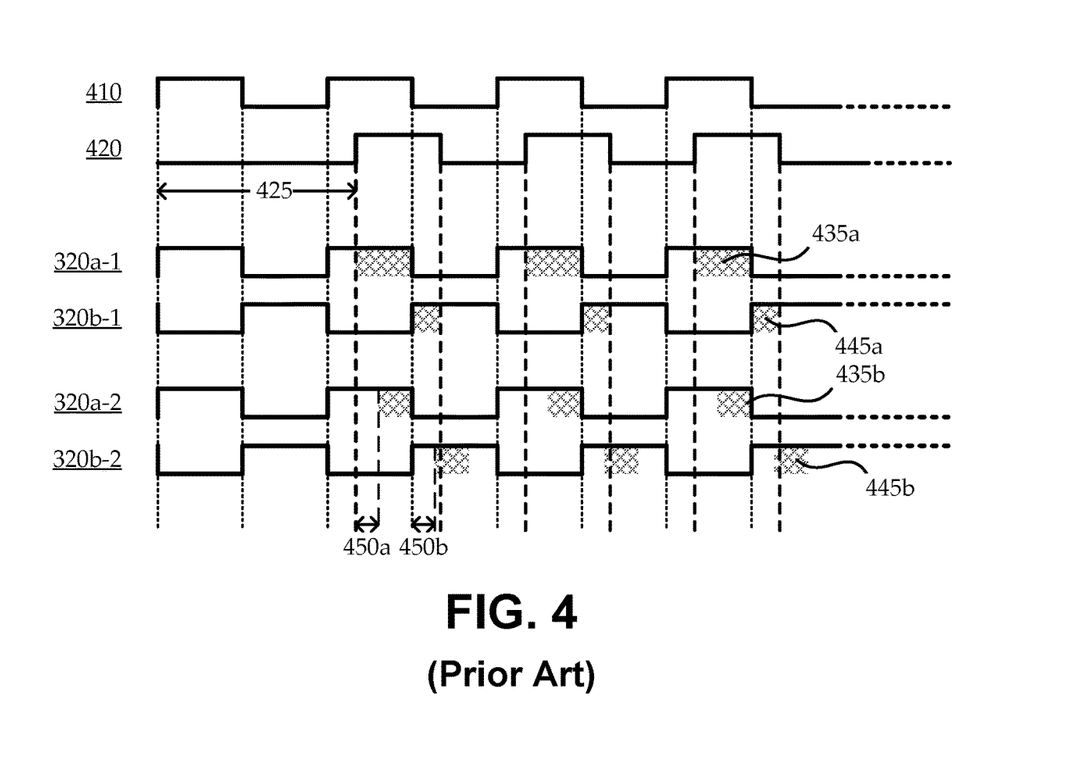
FIG. 4 shows illustrative waveforms to further clarify operation of a ToF photodiode block, such as the conventional ToF photodiode block of FIG. 3.

FIG. 4 shows illustrative waveforms to further clarify operation of a ToF photodiode block, such as the conventional ToF photodiode block 300 of FIG. 3. As described above, ToF photodiode blocks are used to measure distance. For example, a CMOS imaging system includes an illumination source and an array of ToF photodiodes. The illumination source can include one or more infrared sources, VSCELs, or other suitable components for producing an illumination signal. Typically, the illumination signal is modulated in a defined manner. For example, the illumination signal is a series of pulses, such that the amplitude of the illumination signal is substantially a square wave, a pulse-width-modulated (PWM) signal, etc. An example waveform for such an illumination signal, as projected, is illustrated as waveform 410.

The illumination signal is projected into a scene, after which it reflects off of, or otherwise optically interacts with surfaces, objects, etc. at one or more distances from the imaging system. A portion of the reflected illumination signal is received back at the imaging system by the array of ToF photodiode blocks. Each photon of the illumination signal takes some amount of time (a roundtrip time) to travel from the illumination source, to some surface in the scene, and back to the array of ToF photodiode blocks. The roundtrip time manifests as a phase shift between the projected illumination and the received reflected illumination. Waveform 420 represents the illumination signal as detected after reflecting off of a scene surface some distance away. An illustrative phase shift 425 can be seen between the start of the projected illumination signal waveform 410 and the start of the detected reflection waveform 420.

The ToF photodiode blocks can be configured to alternate between transfer gates 215 at a rate corresponding to the modulation frequency of the illumination signal. For example, if the illumination signal is modulated as a 50 Megahertz square wave, the ToF photodiode blocks can be configured to alternate between transfer gates 215 every 10 nanoseconds (e.g., where there are two transfer gates 215). Such switching can be accomplished by configuring activation signals 320 to be complementary 50 Megahertz square waves.

Illustrative waveforms for the activations signals 320 are represented in FIG. 4. It is assumed in the convention of FIG. 4 that floating diffusion region 235a is active when activation signal 320a is HIGH, and floating diffusion region 235b is active when activation signal 320b is HIGH. As illustrated, the complementary activation signals 320 can begin synchronously with projecting the illumination signal. After some time delay, photons from the reflected illumination begin to reach the ToF photodiode blocks. Those photons produce corresponding photocarriers in the photodiode region 310, and those photocarriers are shuttled into whichever floating diffusion region 235 is active. A total elapsed time (e.g., delay) between when a photon reaches the backside of the photodiode region 310 and when the correspondingly generated photocarrier is shuttled out to a presently active floating diffusion region 235 for accumulation is referred to herein as "shuttle time."

Waveforms 320a-1 and 320b-1 represent the activation signals 320 in a first illustrative condition in which the ToF photodiode blocks operate with very small (ideally zero) shuttle time (e.g., and very little accumulation of charge within the photodiode region 310). Shaded regions 435a of activation signal 320a-1 indicate the times when charge is accumulating in floating diffusion region 235a, and shaded regions 445a of activation signal 320b-1 indicate the times when charge is accumulating in floating diffusion region 235a. When there is such a small delay (e.g., on the order of five percent or less of the switching period), it can be seen that the overall timing of charge accumulation in the floating diffusion regions 235 accurately follows the timing of the reflected illumination signal waveform 420. As such, the relative amounts of charge that accumulate in the different floating diffusion regions 235 can accurately indicate the phase shift of the reflected illumination signal waveform 420, which corresponds to the roundtrip distance traveled by the photons of the illumination signal. The roundtrip distance can be used to triangulate the distance (e.g., depth) between the imaging system and whichever surface in the scene produced the reflected illumination signal waveform 420.

Waveforms 320a-2 and 320b-2 represent the same activation signals 320 in a second illustrative condition in which the ToF photodiode blocks operate with relatively large shuttle time. Such a larger shuttle time can be due to various factors, such as a tendency of charge to accumulate in (e.g., become trapped in) portions of the photodiode region 310 and/or to move slowly through the photodiode region 310. An illustrative delay due to the larger shuttle time is indicated by arrows 450a and 450b. Shaded regions 435b of activation signal 320a-2 indicate the times when charge is accumulating in floating diffusion region 235a, and shaded regions 445b of activation signal 320b-2 indicate the times when charge is accumulating in floating diffusion region 235a. Each rising edge of the reflected illumination signal waveform 420 occurs while floating diffusion region 235a is active. However, rather than charge beginning to accumulate there immediately (as ideally represented by shaded regions 435a), the shuttle time results in a delay 450a before charge begins to accumulate (as represented by shaded regions 435b). Similarly, the reflected illumination signal waveform 420 continues to stay HIGH when floating diffusion region 235b becomes active (and floating diffusion region 235a is deactivated). However, rather than charge beginning to accumulate in floating diffusion region 235b as soon as it becomes active (as ideally represented by shaded regions 445a), the shuttle time again results in a delay 450b before charge begins to accumulate (as represented by shaded regions 445*b*). As illustrated by shaded regions 445*b*, because of the shuttle time, charge may also continue to accumulate in floating diffusion region 235*b* even after the reflected illumination signal waveform 420 is no longer HIGH. Delay 450*a* and delay 450*b* can each be slightly different from each other, and may be different from one ToF photodiode block to another, due to non-idealities of the devices, process variations (e.g., asymmetry in doping across the device), etc. It can be seen that, because of the shuttle time, the overall timing of charge accumulation in the floating diffusion regions 235 does not accurately follow the timing of the reflected illumination signal waveform 420. As such, the relative amounts of charge that accumulate in the different floating diffusion regions 235 may not accurately indicate the phase shift of the reflected illumination signal waveform 420 and may not be useful for computing an accurate distance measurement.

Thus, while ToF photodiode blocks can be manufactured using the same process toolsets as non-ToF photodiode blocks (such as those used in photographic, video, and/or other imaging applications), successful implementation of a ToF photodiode block can involve addressing a number of technical design concerns that differ from those of a non-ToF photodiode block. At least some of these technical design concerns can be appreciated from the discussion of FIGS. 3 and 4.

According to one such technical design concern, the transfer portion of the ToF photodiode block includes multiple output taps (e.g., transfer gates and corresponding floating diffusion regions), at least two of the output taps being configured as readout taps. Some implementations of ToF photodiode blocks include at least one other output tap configured as a drain tap for complete draining of the pixel (e.g., when in a reset condition, or otherwise not in use). According to another such technical design concern, it can be desirable for the multiple readout taps to have substantially equivalent performance. According to another such technical design concern, it can be desirable for photocarriers produced in the photodiode region to be drained with near-zero shuttle time (e.g., in real-time) from the photodiode into the output taps and with minimal to no accumulation of charge in the photodiode region. For example, the ToF photodiode block is designed to ensure that the shuttle time from photocarrier creation to collection in an output tap is with minimum temporal delay, such as on the order of a few nanoseconds. According to another such technical design concern, it can be desirable to configure each output tap to perform as a global shutter that is synchronized with a modulated illumination source so as to be able to collect multiple photo-events within a single frame of readout. According to another such technical design concern, it can be desirable for the photodiode region of the ToF photodiode block to be responsive to particular non-visible bands of light, such as near infrared light with a wavelength of 850 nanometers or 940 nanometers). For example, the substrate and doping materials can be selected so that photons in those bands of light have sufficient energy to reliably produce photocarriers in the substrate material. Ultimately, performance of a ToF photodiode block can be indicated by various metrics, such as demodulation efficiency (i.e., corresponding to a measure of how many photo-events are properly collected in the synchronous output tap), quantum efficiency, temporal readout noise, and dark current (i.e., a leakage current measurement corresponding to events in the ToF photodiode block that are created unrelated to illumination).

Embodiments described herein include a novel type of ToF photodiode block referred to herein as a "uniform-bridge-gradient" (UBG) ToF photodiode block. Such a UBG ToF photodiode block can be part of a ToF pixel in a CIS application (e.g., a digital imaging system). In general, the UBG ToF photodiode block is designed with a photodiode region that is optimized for fast shuttle time of photocarriers. Such optimization can use a combination of a pinning or threshold-shifting doping of a first doping type, a photodiode-defining implant of a second doping type, a first bridging implant of the second doping type to bridge along the tap-edge of the photodiode region to connect multiple taps and provide a lateral gradient, and a deep second bridging implant of the second doping type for further bridging and lateral gradient production.

Figure 5A:
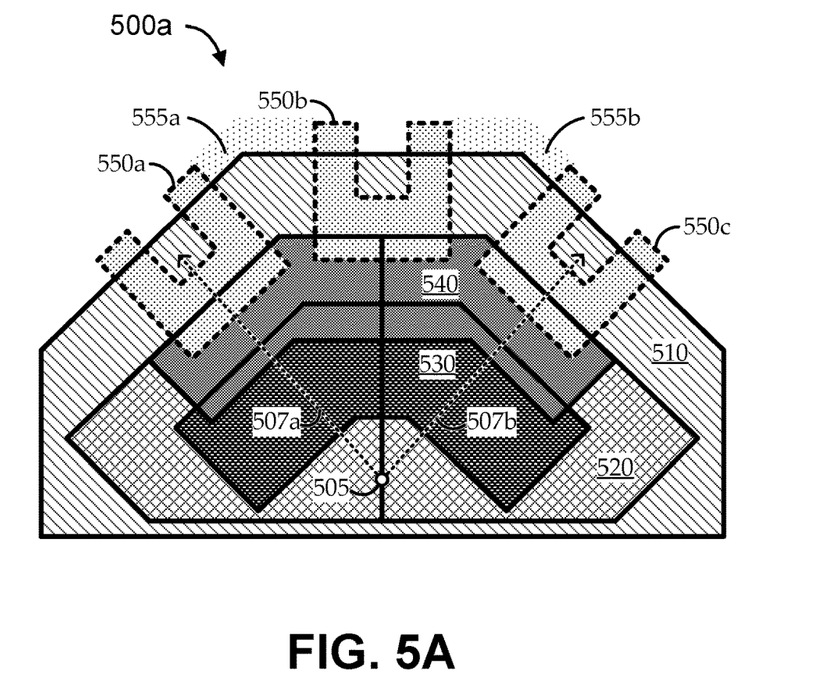
FIGS. 5A and 5B show a planar layout view and a side cut view, respectively, of an illustrative pinned photodiode (PPD) type of uniform bridge gradient (UBG) ToF photodiode block, according to various embodiments described herein.
Figure 5B:
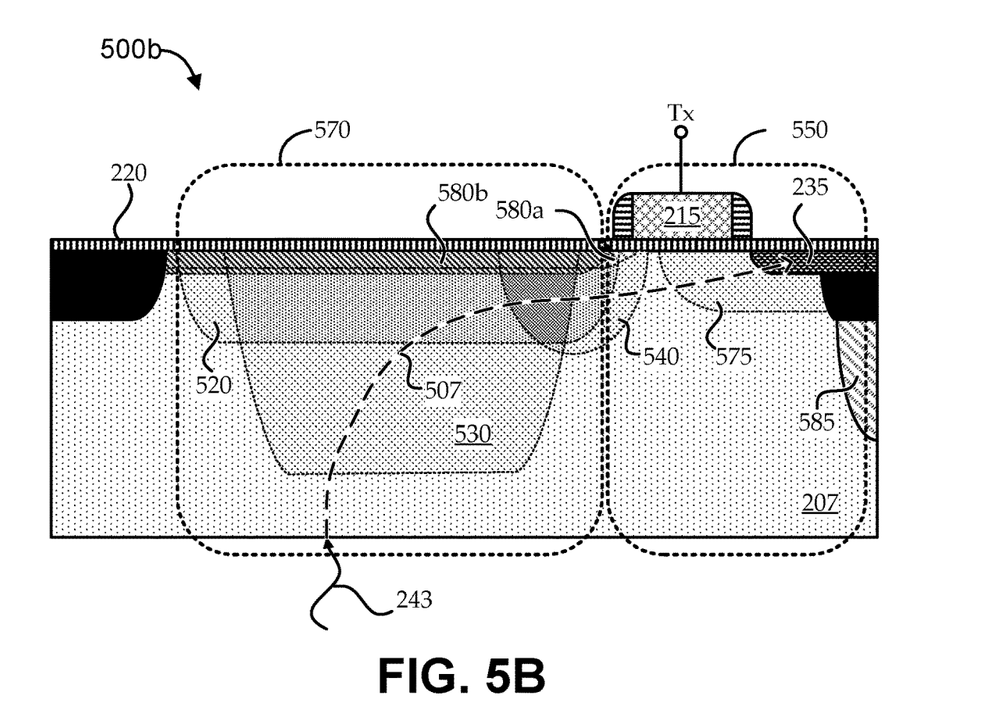

FIGS. 5A and 5B show a planar layout view and a side cut view, respectively, of an illustrative pinned photodiode (PPD) type of UBG ToF photodiode block 500, according to various embodiments described herein. As illustrated in FIG. 5A, the PPD-type UBG ToF photodiode block 500 is built on a defined block region 510 of a semiconductor substrate, such as on an oxide diffusion region. The semiconductor substrate (e.g., the oxide diffusion region) is made of material having a first doping type, such as p-type silicon. Multiple taps 550 are disposed along edges of the defined block region 510, and the multiple taps 550 include at least a first readout tap 550*a* and a second readout tap 550*c*. As described herein, each tap 550 includes a transfer gate configured for selective activation by an activation network.

The PPD-type UBG ToF photodiode block 500 also has a photodiode region implanted into the semiconductor substrate within the defined block region 510, which includes at least a photodiode-defining implant 520, a first bridging implant 540, and a second bridging implant 530. Each of the photodiode-defining implant 520, first bridging implant 540, and second bridging implant 530 is of a second doping type complementary to the first doping type. In general, one of the first or second doping types is p-type, and the other of the first or second doping types is n-type. For example, if the first doping type (e.g., of the substrate) is p-type, all of the photodiode-defining implant 520, first bridging implant 540, and second bridging implant 530 are n-type doped regions. Though not explicitly shown in the planar view of FIG. 5A, the photodiode region also includes a pinning implant that is heavily doped with material of the first doping type. The pinning implant generally extends over at least the entire photodiode region and is implanted to a shallow (fourth) implant depth. The pinning implant can provide various features, such as providing a passivation layer to decrease interface generation of dark current.

As described further below, the boundaries of the photodiode-defining implant 520 can be considered as defining the boundaries of the photodiode region, and the photodiode-defining implant 520 is implanted nominally to a first implant depth. The first bridging implant 540 is implanted nominally to a second implant depth and diffuses over a first portion of the photodiode region to nominally form a first lateral bridge region across the taps 550 along an edge of the photodiode region nearest to the taps 550. The second bridging implant 530 is implanted nominally to a third implant depth and diffuses over a second portion of the photodiode region to nominally form a second lateral bridge region across the taps 550. The second lateral bridge region at least partially overlaps with both the photodiode-defining implant 520 and the first bridging implant 540. The third implant depth (of the second bridging implant 530) is deeper than both the first implant depth (of the photodiode-defining implant 520) and the second implant depth (of the first bridging implant 540).

As used herein, the term "nominal" (or "nominally") is intended to mean "as designed to be." A nominally defined characteristic, measurement, quantity, shape, etc. is as defined in accordance with a manufacturing and/or technical design specification, even though such a nominal definition cannot be precisely met in a practical manufacturing environment. For example, the technical design of a PPD-type UBG ToF photodiode block 500 may define a particular implant (doped region) to have a particular shape, a particular doping concentration, etc. Those design-specified values (i.e., the nominal values for that region) can ultimately be used for computer-aided design, computer-aided simulation, manufacturing specifications, testing specifications, etc. When such an implant is manufactured, doping and other manufacturing processes are used to implant and diffuse a doped region into the semiconductor substrate, and those doping and other manufacturing processes are carefully tailored to meet the nominal specifications to within some predefined range (e.g., statistically defined by process corners, etc.) and/or other acceptance criteria. Due to process variations, practical manufacturing limitations, and physical limitations of the materials, the manufactured implant may have a shape that approximates the nominally defined target shape, but is actually irregular with undefinable boundaries; the manufactured implant may have an overall doping concentration that falls statistically within a band around the nominally defined target concentration, but also varies across the implanted region; etc. Similarly, while an implant or other region may have a nominally defined geometric characteristics, such as a nominal shape, or nominally defined geometric relationships (e.g., parallel features, etc.), it is understood that a manufactured implementation may only be able to meet such geometric characteristics within a practical level of precision. For example, reference to a feature as "symmetric" is intended to suggest that such a feature is manufactured within an acceptable level of symmetry given real-world practical constraints.

During operation of the PPD-type UBG ToF photodiode block 500, taps 550 are selectively activated to produce a corresponding transfer path (including by forming a current channel) to transfer any photocarriers out of the photodiode region and into either a collection node or a drain. It is desirable for the transfer paths (at least those corresponding to the readout taps 550) to be as equivalent as possible, so that relative amounts of photocarrier collection by the different readout taps 550 can be accurately compared. To that end, geometries of the different regions, including those of the block region 510, the photodiode-defining implant 520, the first bridging implant 540, and the second bridging implant 530, can be designed to help minimize and/or match transfer path lengths to the different taps 550.

For example, as illustrated in FIG. 5A, the defined block region 510 can have a planar geometric shape (i.e., a geometric shape with respect to the planar view of FIG. 5) that is nominally symmetric and nominally trapezoidal. The specific planar geometric shape shown in FIG. 5 is a hexagon with an upper trapezoidal portion and a lower rectangular portion. The upper trapezoidal portion includes a top edge, a first side edge extending from the respective top edge at a first angle, and a second side edge extending from the respective top edge at a second angle. The first and second angles can be supplementary, such that the planar geometric shape has left-right symmetry. The lower rectangular portion can include a bottom edge that is parallel to and wider than the top edge, and third and fourth side edges that are parallel.

As illustrated, each of the photodiode-defining implant 520, the first bridging implant 540, and the second bridging implant 530 can be formed to have a respective nominal planar layout shape that generally follows the top and angled side edges of the defined block region 510. For example, an upper contour of each of the photodiode-defining implant 520, the first bridging implant 540, and the second bridging implant 530 follows the upper contour (the top and angled side edges) of the block region 510, respectively. Further, a lower contour of the second bridging implant 530 and the first bridging implant 540 can also generally follow the respective upper contours. Each implant of the photodiode region, can be designed to have a nominally constant doping profile laterally across the contour of the implant. For example, a region of the first bridging implant 540 located between the bottom edge of the first readout tap 550a and a first angled side edge of the second bridging implant 530 nominally has an identical doping profile as a region of the first bridging implant 540 located between the bottom edge of the second readout tap 550c and a second angled side edge of the second bridging implant 530.

Taps 550 can be positioned and oriented in accordance with the upper contour edges of the block region 510. As illustrated, a first readout tap 550a overlaps with and is oriented to the first side edge of the block region 510 and can extend to overlap with a corresponding edge of the first bridging implant 540, and a second readout tap 550c overlaps with and is oriented to the second side edge of the block region 510 and can extend to overlap with a corresponding edge of the first bridging implant 540. A drain tap 550b can similarly overlaps with and be oriented to the top edge of the block region 510 and can extend to overlap with a corresponding edge of the first bridging implant 540.

Such a geometry can help provide equivalence between different transfer paths for a photocarrier. An example photocarrier location 505 is illustrated. If readout tap 550a is activated, a photocarrier in location 505 is attracted along a first illustrated transfer path 507a having a path length, assisted by various features of the photodiode region, such as enhanced impacts of deep second bridging implant 530 on voltage potential, and by doping gradients created by the combination of the photodiode-defining implant 520, the second bridging implant 530, and the first bridging implant 540. If readout tap 550c is activated, a photocarrier in the same location 505 is attracted along a second illustrated transfer path 507b having a substantially identical path length, assisted by apparently identical features of the photodiode region. As such, with a geometry such as illustrated in FIG. 5A, the shuttle time for a photocarrier can be nominally identical for all readout taps 550.

Some implementations also include tap isolation regions 555 between the taps 550. For example, a tap isolation region 555 of the first doping type (e.g., the same doping as the block region 510 in the same or higher concentration) is located between each pair of adjacent taps 550. Such tap isolation regions 555 can provide various features, such as helping to eliminate localized wells between taps 550 that can trap or delay photocarries, and/or helping to minimize physical crosstalk between adjacent taps 550.

Turning to FIG. 5B, a cross-sectional view is shown of the PPD-type UBG ToF photodiode block 500. The cross-sectional view can represent a cut through the PPD-type UBG ToF photodiode block 500a of FIG. 5A according to a cut plane that is orthogonal to the plane of the planar view.

Structures of the PPD-type UBG ToF photodiode block 500 are either implanted in, or disposed on a semiconductor substrate 207, such as an oxide diffusion region. As illustrated, the PPD-type UBG ToF photodiode block 500 includes a photodiode region 570 and a tap 550 region. Within the photodiode region 570 is the photodiode-defining implant 520, the first bridging implant 540, and the second bridging implant 530. The photodiode region 570 can also include one or more pinning implants (illustrated as implants 580a and 580b). For example, pinning implant 580a can be similar to the pinning region 225 of FIG. 2, and pinning implant 580b can be an overlapping implant with an even higher doping concentration than that of pinning implant 580a.

The tap 550 region (i.e., which is one of multiple, nominally equivalent taps of the PPD-type UBG ToF photodiode block 500) can include at least a transfer gate 215 and a floating diffusion region 235 as a collection node. The transfer gate 215 can be isolated from the substrate 207 by an oxide layer 220. Embodiments can include additional structures. In the illustrated implementation, the tap 550 region includes a floating diffusion gradient implant 575 that can shorten the distance traveled by a photocarrier through a depletion region between the photodiode region 570 and the tap 550 region when the transfer gate 215 is activated (i.e., and thereby further shorten the shuttle time). In the illustrated implementation, the tap 550 region also includes a deep well 585 of first-doping-type material (e.g., p-type material for a p-type substrate 207). Other implementations can include additional or different structures, such as one or more coplanar wave guides, isolation regions, etc.

The various implants of the photodiode region 570 are configured to provide what is referred to herein as a "uniform bridge gradient," or UBG. As described in relation to FIG. 5A, one feature of the UBG is to bridge laterally across the multiple taps 550 of the PPD-type UBG ToF photodiode block 500. Another feature of the UBG, as can be seen more clearly in FIG. 5B, is to provide a doping gradient that seeks to rapidly move photocarriers through the photodiode region 570, with minimal to no accumulation in the photodiode region 570, for complete and efficient transfer via the transfer gate 215 into the floating diffusion region 235. Another feature of the UBG is that the doping gradient is nominally uniform across the lateral bridge, so that transfer paths and corresponding shuttle times are nominally equivalent for all readout taps 550.

To that end, as illustrated, the photodiode-defining implant 520 is implanted nominally to a first implant depth over the photodiode region 570. The first bridging implant 540 is implanted to a second implant depth over a first portion of the photodiode region that is along an edge of the photodiode region 570 nearest to the tap 550 region (which forms a first lateral bridge region across the taps 550, as illustrated in FIG. 5A). The second bridging implant 530 is implanted to a third implant depth over a second portion of the photodiode region 570 that at least partially overlaps with both the photodiode-defining implant 520 and the first bridging implant 540 (which forms a second lateral bridge region across the taps 550, as illustrated in FIG. 5A). The third implant depth (of the second bridging implant 530) is appreciably deeper than both the first implant depth and the second implant depth. In some implementations, the second bridging implant 530 is implanted earlier in the manufacturing process to provide for deeper implantation with increased lateral diffusion; and the first bridging implant 540 is implanted later in the manufacturing process, such as just prior to, or just after forming the transfer gate 215.

The configuration of the photodiode region 570 provides various features to support implementation of the UBG. One feature is that the deep second bridging implant 530 can impact the potential across the substrate 207 to form a minimum-geometry band (i.e., minimum geometry with respect to manufacturing process constraints, and/or other design constraints) near the tap 550 region to enhance creation of fringing fields (i.e., electrical fields). The enhanced fringing fields can improve lateral and vertical photocarrier (i.e., photocharge) shuttle time. Another feature is that, increasing the energy of the implant to increase the depth of the second bridging implant 530 can increase the quantum efficiency in the desired optical bands (e.g., near infrared). Another feature is that the second bridging implant 530 can be implanted and doped, such that the second bridging implant 530 and the photodiode-defining implant 520 form a doping gradient that is nominally uniform across the second lateral bridge region. Another feature is that the first bridging implant 540 can be implanted and doped, such that the first bridging implant 540 and the photodiode-defining implant 520 form a doping gradient that is nominally uniform across the first lateral bridge region. The doping gradients can effectively combine, such that the first bridging implant 540, the photodiode-defining implant 520, and the second bridging implant 530 together form a full UBG (i.e., a nominally uniform doping gradient) across the first lateral bridge region and the second lateral bridge region. Another feature is that the first bridging implant 540 can be formed with a uniform bridging critical dimension that creates a lateral field to further improve photocarrier shuttle time without creating localized potential wells that can tend to frustrate or interrupt photocarrier transit.

For added clarity, an example transit path 507 is illustrated. A photon 243 can hit the backside of the substrate 207 with enough energy to produce a photocarrier in the substrate 207. For example, an electron and a hole are formed by the collision of the photon 243 with the substrate 207 lattice, and the hole is attracted toward a negative potential away from the photodiode region 570 implants (assumed to be n-type implants in this example). The electron (i.e., the photocarrier in this example) is attracted through the fringing fields to the second bridging implant 530, where the doping gradient pulls the electron quickly through the second bridging implant 530, photodiode-defining implant 520, and first bridging implant 540. There, the electron can pass through the current channel formed by the depletion region below the activated transfer gate 215 and into the floating diffusion region 235 for collection. Notably, at any time, a selected one of the multiple taps 550 of the PPD-type UBG ToF photodiode block 500 will be active, such that there will always be an active current path leading out of the photodiode region 570 via whichever tap 550 is active. Because the UBG provides a uniform bridge between the photodiode region 570 and all of those taps 550, a photocarrier generated in the substrate 207 can always have the opportunity for complete and rapid transfer through, and out of, the photodiode region 570 without accumulation.

Figure 6A:
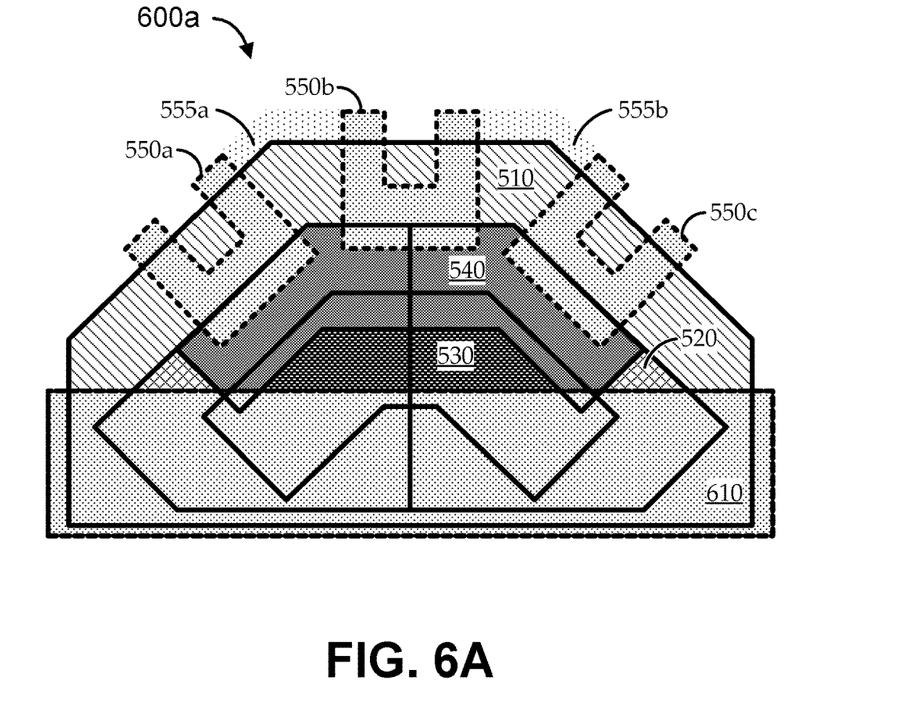
FIGS. 6A and 6B show a planar layout view and a side cut view, respectively, of an illustrative photogate (PG) type of UBG ToF photodiode block, according to various embodiments described herein.
Figure 6B:
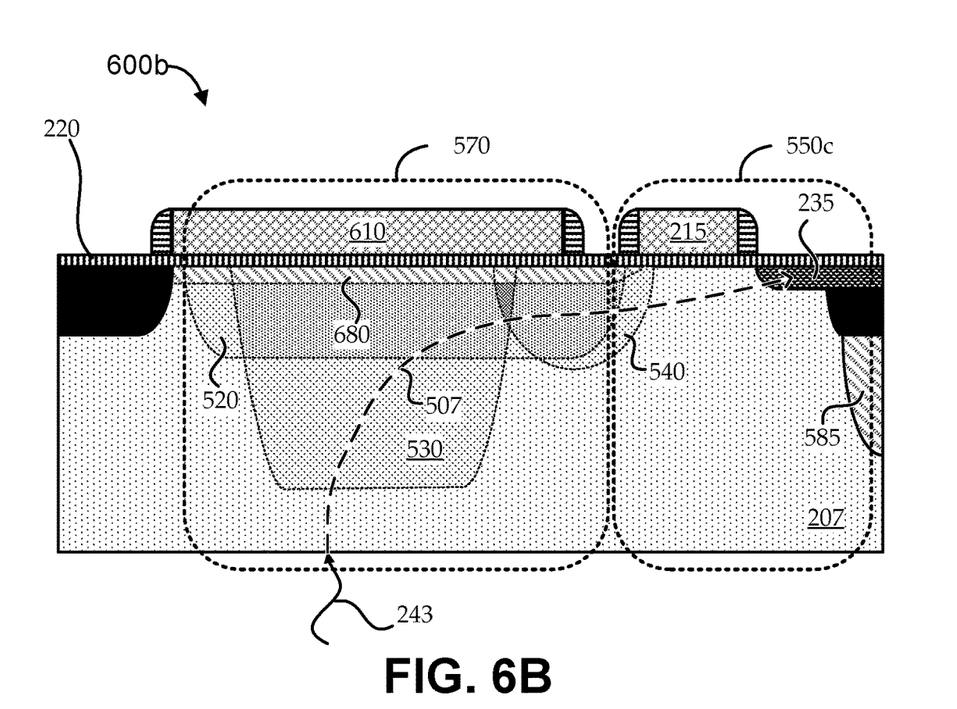

FIGS. 6A and 6B show a planar layout view and a side cut view, respectively, of an illustrative photogate (PG) type of UBG ToF photodiode block 600, according to various embodiments described herein. The PG-type UBG ToF photodiode block 600 can be substantially the same as the PPD-type UBG ToF photodiode block 500 described in FIGS. 5A and 5B, except that the photodiode region 570 is configured as a photogate photodiode, rather than as a pinned photodiode. As such, for added clarity, features that are substantially the same between the types of UBG ToF photodiode blocks are labeled with the same reference designators and can be assumed to operate in substantially the same manner.

As illustrated in FIG. 6A, similar to the PPD-type UBG ToF photodiode block 500, the PG-type UBG ToF photodiode block 600 is built on a defined block region 510 of a semiconductor substrate, and multiple taps 550 are disposed along edges of the defined block region 510 (including at least a first readout tap 550a and a second readout tap 550c). A third (drain) tap 550b can be included. The PG-type UBG ToF photodiode block 600 also has a photodiode region implanted into the semiconductor substrate within the defined block region 510, which includes at least a photodiode-defining implant 520, a first bridging implant 540, and a second bridging implant 530. Unlike the PPD-type UBG ToF photodiode block 500, the PG-type UBG ToF photodiode block 600 includes a photogate 610 disposed on the semiconductor substrate above at least a portion of the photodiode-defining implant 520 and at least a portion of the second bridging implant 530 (e.g., and above at least a portion of the first bridging implant 540, in some implementations).

The photogate 610 can also be seen in FIG. 6B, extending across the photodiode region 570. Though not explicitly shown in the planar view of FIG. 6A, FIG. 6B shows that the photodiode region 570 can further include a threshold shift implant 680 (e.g., similar to the pinning implant 580 of the PPD-type UBG ToF photodiode block 500) that is heavily doped with material of the first doping type. The threshold shift implant 680 generally extends over at least the entire photodiode region and is implanted to a shallow (fourth) implant depth and can provide various features, such as providing a passivation layer to decrease interface generation of dark current. Because of differences in operational impact between the pining features of the PPD-type implementations and the photogate features of the PG-type implementations, geometries, doping concentrations, and/or other implant characteristics can be designed differently between the different implementations. For example, the second bridging implant 530 is shown as narrower and deeper in FIG. 6B, as compared to FIG. 5B.

Figure 7:
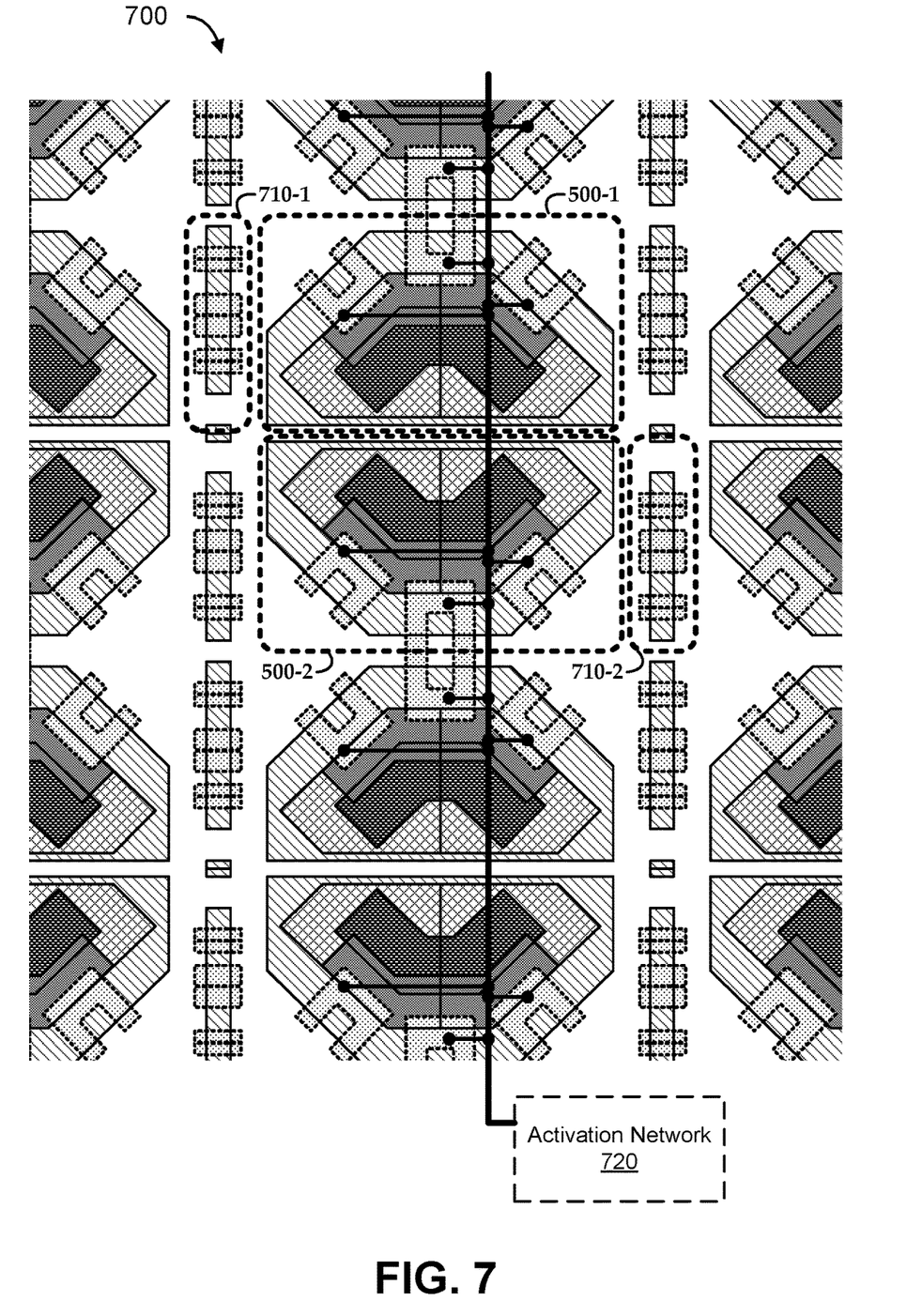
FIG. 7 shows an illustrative layout of an array of UBG ToF pixels, according to various embodiments described herein.

FIG. 7 shows an illustrative layout 700 of an array of UBG ToF pixels, according to various embodiments described herein. Each UBG ToF pixel is illustrated as having an instance of the PPD-type UBG ToF photodiode block 500 and a corresponding instance of a readout block 710. The same structure can be manufactured using other implementations of the UBG ToF photodiode block, such as the PG-type UBG ToF photodiode block 600 of FIGS. 6A and 6B. Each instance of the readout block 710 can include respective instances of the readout structure 250 components, such as a reset transistor, a select transistor, and a source follower transistor. Some implementations of the readout block 710 can include additional components, such as for dynamic conversion gain. The illustrated layout 700 has pairs of pixels laid out with the bottom edges of the UBG ToF photodiode blocks facing each other, such that each pixel in the pair is effectively a 180-degree rotation of the other pixel in the pair.

The illustrative layout 700 is shown in communication with an activation network 720. As described herein, each UBG ToF photodiode block (e.g., each PPD-type UBG ToF photodiode block 500) of each UBG ToF pixel includes multiple taps 550, including at least multiple readout taps 550. The multiple taps 550 are configured for selective activation by the activation network 720 according to a gate-to-gate modulation. With two readout taps 550, the activation network 720 alternately activates the transfer gates 215 of the readout taps 550 at a modulation frequency. For example, each readout tap 550 is active for a respective half of a modulation period (Tm). With N readout taps 550, where N is an integer greater than 2, the activation can be in a round-robin fashion, such that each readout tap 550 is active for a respective Tm/N.

When the UBG ToF pixel is not in active use for depth sensing, or prior to operation, the activation network 720 can activate the drain tap 550 to reset the pixel and drain any accumulated charge from the photodiode region 570. The reset block of the readout block 710 can also be used to reset the readout taps 550 by effectively draining the collection nodes. The activation network 720 can then begin its gate-to-gate modulation to facilitate use of the UBG ToF pixel for depth sensing. As described above, the gate-to-gate modulation is synchronous with modulation of an illumination signal generated by an illumination source in communication with the activation network 720. As used herein, "modulation of an illumination source," modulation of an illumination signal," or the like is intended generally to include any suitable type of optical modulation, illumination pulses, etc. As described above, the photodiode region 570 of the UBG ToF photodiode block of the UBG ToF pixel seeks to provide complete transit of photocarriers out of the photodiode region 570 and into the collection nodes with minimal shuttle time. In some embodiments, the shuttle time is less than the gate-to-gate modulation period, Tm. As such, selective activation by the activation network 720 of any selected one of the taps 550 causes a full transfer of charge out of the photodiode region via the selected one of the taps 550 within a shuttle time shorter than Tm. In some embodiments, the shuttle time is shorter than the portion of Tm allotted to each of the multiple taps 550 (i.e., shorter than Tm/N for implementations with N readout taps 550). Once collection of photocarriers in the collection nodes is complete, the relative amounts of accumulated charge for the different taps 550 can be readout in any suitable manner by at least the readout block 710. Some embodiments use a rolling shutter frame readout with double sampling.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A uniform-bridge-gradient (UBG) time-of-flight (ToF) photodiode block comprising:
    a plurality of taps disposed onto a semiconductor substrate of a first doping type, the plurality of taps comprising at least a first readout tap and a second readout tap, each of the plurality of taps having one of a plurality of transfer gates configured for selective activation by an activation network;
    a photodiode region implanted into the semiconductor substrate and comprising:
        a photodiode-defining implant of a second doping type complementary to the first doping type implanted to a first implant depth over the photodiode region;
        a first bridging implant of the second doping type implanted to a second implant depth over a first portion of the photodiode region that forms a first lateral bridge region across the plurality of taps along an edge of the photodiode region nearest to the plurality of taps; and
        a second bridging implant of the second doping type implanted to a third implant depth over a second portion of the photodiode region that forms a second lateral bridge region across the plurality of taps and at least partially overlaps with both the photodiode-defining implant and the first bridging implant, the third implant depth being deeper than both the first implant depth and the second implant depth.

2. The UBG ToF photodiode block of claim 1, wherein the photodiode region further comprises:
    a pinning implant heavily doped with material of the first doping type and implanted to a fourth implant depth over at least the photodiode region, the fourth implant depth being shallower than the first implant depth.

3. The UBG ToF photodiode block of claim 1, further comprising:
    a photogate disposed on the semiconductor substrate above at least a portion of the photodiode-defining implant and at least a portion of the second bridging implant,
    wherein the photodiode region further comprises a threshold shift implant heavily doped with material of the first doping type and implanted to a fourth implant depth over at least the photodiode region, the fourth implant depth being shallower than the first implant depth.

4. The UBG ToF photodiode block of claim 1, wherein the plurality of taps is configured for selective activation by the activation network according to a gate-to-gate modulation between the plurality of transfer gates that is synchronous with modulation of an illumination signal generated by an illumination source in communication with the activation network.

5. The UBG ToF photodiode block of claim 4, wherein:
    the gate-to-gate modulation defines a modulation period; and
    the selective activation by the activation network of any selected one of the plurality of taps causes a full transfer of charge out of the photodiode region via the selected one of the plurality of taps within a shuttle time shorter than the modulation period.

6. The UBG ToF photodiode block of claim 1, wherein:
    the first readout tap has a first collection node, selective activation of a first transfer gate of the first readout tap forming a first current channel between the photodiode region and the first collection node;
    the second readout tap has a second collection node, selective activation of a second transfer gate of the second readout tap forming a second current channel between the photodiode region and the second collection node; and
    the first current channel and the second current channel are nominally equivalent.

7. The UBG ToF photodiode block of claim 6, wherein the plurality of taps further comprises a drain tap coupled with a drain node, selective activation of a third transfer gate of the drain tap forming a third current channel between the photodiode region and the drain node to drain accumulated charge from the photodiode region.

8. The UBG ToF photodiode block of claim 1, wherein the second bridging implant is implanted and doped, such that the second bridging implant and the photodiode-defining implant form a doping gradient that is nominally uniform across the second lateral bridge region.

9. The UBG ToF photodiode block of claim 8, wherein the first bridging implant is implanted and doped, such that the first bridging implant, the photodiode-defining implant, and the second bridging implant together form the doping gradient that is nominally uniform across the first lateral bridge region and the second lateral bridge region.

10. The UBG ToF photodiode block of claim 1, further comprising:
    a plurality of tap isolation regions each of the first doping type, and each disposed between a respective pair of the plurality of taps.

11. The UBG ToF photodiode block of claim 1, further comprising:
    an oxide diffusion region having each of the photodiode-defining implant, the first bridging implant, and the second bridging implant implanted therein, wherein:
        each of the oxide diffusion region, the photodiode-defining implant, the first bridging implant, and the second bridging implant is formed to have a respective planar layout shape that comprises a nominally symmetric upper contour defined by at least a respective top edge, a respective first side edge extending from the respective top edge at a first angle, and a respective second side edge extending from the respective top edge at a second angle, such that each respective top edge is parallel with others of the respective top edges, each respective first side edge is parallel with others of the respective first side edges, and each respective second side edge is parallel with others of the respective second side edges;

the first readout tap overlaps with and is oriented to the respective first side edge of the oxide diffusion region and the respective first side edge of the first bridging implant; and the second readout tap overlaps with and is oriented to the respective second side edge of the oxide diffusion region and the respective second side edge of the first bridging implant.

12. A complementary metal-oxide semiconductor (CMOS) image sensor (CIS) comprising:
a semiconductor substrate of a first doping type;
an array of uniform-bridge-gradient (UBG) time-of-flight (ToF) pixels integrated with the semiconductor substrate, each UBG ToF pixel having a respective one of a plurality of UBG ToF photodiode blocks, each UBG ToF photodiode block comprising:
a plurality of taps disposed onto the semiconductor substrate and comprising at least a first readout tap and a second readout tap, each of the plurality of taps having a respective one of a plurality of transfer gates configured for selective activation by an activation network and a respective one of a plurality of collection nodes;
a photodiode region implanted into the semiconductor substrate and comprising:
a photodiode-defining implant of a second doping type complementary to the first doping type implanted to a first implant depth over the photodiode region;
a first bridging implant of the second doping type implanted to a second implant depth over a first portion of the photodiode region that forms a first lateral bridge region across the plurality of taps along an edge of the photodiode region nearest to the plurality of taps; and
a second bridging implant of the second doping type implanted to a third implant depth over a second portion of the photodiode region that forms a second lateral bridge region across the plurality of taps and at least partially overlaps with both the photodiode-defining implant and the first bridging implant, the third implant depth being deeper than both the first implant depth and the second implant depth.

13. The CIS of claim 12, wherein each UBG ToF pixel further comprises a readout block in communication with the plurality of taps to selectively readout charge accumulated in the plurality of collection nodes.

14. The CIS of claim 12, wherein each of the plurality of UBG ToF photodiode blocks is configured as a pinned-photodiode-type UBG ToF photodiode block, the photodiode region of each of the plurality of UBG ToF photodiode blocks further comprising a pinning implant heavily doped with material of the first doping type and implanted to a fourth implant depth over at least the photodiode region, the fourth implant depth being shallower than the first implant depth.

15. The CIS of claim 12, wherein each of the plurality of UBG ToF photodiode blocks is configured as a photogate-photodiode-type UBG ToF photodiode block, each UBG ToF photodiode block further comprising a photogate disposed on the semiconductor substrate above at least a portion of the photodiode-defining implant and at least a portion of the second bridging implant, and the photodiode region of each UBG ToF photodiode block further comprising a threshold shift implant heavily doped with material of the first doping type and implanted to a fourth implant depth over at least the photodiode region, the fourth implant depth being shallower than the first implant depth.

16. The CIS of claim 12, wherein, in each UBG ToF photodiode block, the second bridging implant is implanted and doped, such that the second bridging implant and the photodiode-defining implant form a doping gradient that is nominally uniform across the second lateral bridge region.

17. The CIS of claim 16, wherein, in each UBG ToF photodiode block, the first bridging implant is implanted and doped, such that the first bridging implant, the photodiode-defining implant, and the second bridging implant together form the doping gradient that is nominally uniform across the first lateral bridge region and the second lateral bridge region.

18. The CIS of claim 12, wherein, in each UBG ToF photodiode block:
selective activation of a first transfer gate of the first readout tap forms a first current channel between the photodiode region and a first collection node;
selective activation of a second transfer gate of the second readout tap forms a second current channel between the photodiode region and a second collection node; and
the first current channel and the second current channel are nominally equivalent.

19. The CIS of claim 12, further comprising:
the activation network in electrical communication with the plurality of transfer gates of the plurality of UBG ToF photodiode blocks.

20. The CIS of claim 19, wherein:
the activation network is configured to be in communication with an illumination system that generates an illumination signal by modulating an illumination source;
the activation network is configured to selectively activate the plurality of taps according to a gate-to-gate modulation between the plurality of transfer gates that is synchronous with the modulation of the illumination source by the illumination system and defines a modulation period; and
each of the UBG ToF photodiode blocks is configured so that the selective activation by the activation network of any selected one of the plurality of taps causes a full transfer of charge out of the photodiode region via the selected one of the plurality of taps within a shuttle time shorter than the modulation period.

\* \* \* \* \*